United States Patent
Yang et al.

(10) Patent No.: US 8,263,493 B2
(45) Date of Patent: Sep. 11, 2012

(54) SILICON CHIP HAVING THROUGH VIA AND METHOD FOR MAKING THE SAME

(75) Inventors: Hsueh-An Yang, Kaohsiung (TW); Pei-Chun Chen, Kaohsiung (TW); Chien-Hua Chen, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 280 days.

(21) Appl. No.: 12/647,856

(22) Filed: Dec. 28, 2009

(65) Prior Publication Data
US 2010/0230759 A1    Sep. 16, 2010

(30) Foreign Application Priority Data
Mar. 13, 2009   (TW) ................................ 98108312 A

(51) Int. Cl.
*H01L 21/4763* (2006.01)
*H01L 21/44* (2006.01)

(52) U.S. Cl. ........ 438/667; 438/637; 438/639; 438/672; 438/E21.597; 257/E21.597

(58) Field of Classification Search .................. 438/667, 438/637, 639, 672, E21.597
See application file for complete search history.

(56) References Cited

U.S. PATENT DOCUMENTS

| 5,229,647 | A  | * | 7/1993  | Gnadinger ............... 257/785 |
| 6,087,719 | A  | * | 7/2000  | Tsunashima ............ 257/686 |
| 6,831,367 | B2 | * | 12/2004 | Sekine .................... 257/774 |
| 7,863,189 | B2 | * | 1/2011  | Basker et al. ............ 438/667 |
| 7,880,307 | B2 | * | 2/2011  | Farnworth et al. ....... 257/774 |
| 7,989,345 | B2 | * | 8/2011  | Akram et al. ............. 438/667 |
| 7,994,048 | B2 | * | 8/2011  | Komuro .................. 438/629 |
| 2004/0061238 | A1 | * | 4/2004 | Sekine .................... 257/774 |
| 2004/0203224 | A1 | * | 10/2004 | Halahan et al. ......... 438/637 |
| 2006/0061238 | A1 | * | 3/2006 | Ikeda et al. ............. 310/341 |
| 2006/0281307 | A1 | * | 12/2006 | Trezza .................... 438/672 |
| 2008/0119046 | A1 |   | 5/2008  | Sparks et al. |

* cited by examiner

*Primary Examiner* — Nitin Parekh
(74) *Attorney, Agent, or Firm* — McCracken & Frank LLC

(57) ABSTRACT

The present invention relates to a silicon chip having a through via and a method for making the same. The silicon chip includes a silicon substrate, a passivation layer, at least one electrical device and at least one through via. The passivation layer is disposed on a first surface of the silicon substrate. The electrical device is disposed in the silicon substrate, and exposed to a second surface of the silicon substrate. The through via includes a barrier layer and a conductor, and penetrates the silicon substrate and the passivation layer. A first end of the through via is exposed to the surface of the passivation layer, and a second end of the through via connects the electrical device. When a redistribution layer is formed on the surface of the passivation layer, the redistribution layer will not contact the silicon substrate, thus avoiding a short circuit. Therefore, a lower resolution process can be used, which results in low manufacturing cost and simple manufacturing process.

16 Claims, 8 Drawing Sheets

SILICON CHIP HAVING THROUGH VIA AND METHOD FOR MAKING THE SAME

BACKGROUND OF THE INVENTION

1. Field of the Invention

The present invention relates to a silicon chip and a method for making the same, and more particularly to a silicon chip having a through via and a method for making the same.

2. Description of the Related Art

FIG. 1 shows a cross-sectional view of a conventional silicon chip having a through via, and FIG. 2 is a partial enlarged view of FIG. 1. The conventional silicon chip 1 having a through via has a silicon substrate 11, at least one electrical device 12, at least one through via 13, a passivation layer 14 and a redistribution layer 15. The silicon substrate 11 has a first surface 111, a second surface 112 and at least one through hole 113. The electrical device 12 is disposed in the silicon substrate 11, and exposed to the second surface 112 of the silicon substrate 11. The through via 13 penetrates the silicon substrate 11. The through via 13 comprises a barrier layer 133 and a conductor 134. The barrier layer 133 is disposed on the side wall of the through hole 113, and the conductor 134 is disposed in the barrier layer 133. The through via 13 has a first end 131 and a second end 132. The first end 131 is exposed to the first surface 111 of the silicon substrate 11, and the second end 132 connects the electrical device 12. The passivation layer 14 is disposed on the first surface 111 of the silicon substrate 11, and the passivation layer 14 has a surface 141 and at least one opening 142. The opening 142 exposes the first end 131 of the through via 13. The redistribution layer 15 is disposed on the surface 141 and the opening 142 of the passivation layer 14, and the redistribution layer 15 has at least one electrically connecting area 151, and the electrically connecting area 151 connects the first end 131 of the through via 13.

The conventional silicon chip 1 having a through via has the following disadvantages. The diameter $D_1$ of the opening 142 of the passivation layer 14 must be smaller than the diameter $D_2$ of the through hole 113 of the silicon substrate 11, or the electrically connecting area 151 of the redistribution layer 15 will directly contact the silicon substrate 11, which will lead to a short circuit. However, the passivation layer 14 is generally patterned by an exposing and developing process, and the resolution of the process is low, so accurate and precise patterns cannot be manufactured. Therefore, the diameter $D_1$ of the opening 142 of the passivation layer 14 is likely to be greater than the diameter $D_2$ of the through hole 113 of the silicon substrate 11, and the electrically connecting area 151 of the redistribution layer 15 will directly contact the silicon substrate 11, which will lead to a short circuit. On the other hand, if the passivation layer 14 is patterned by a high resolution process, more subsequent processes are needed, so the method will become complex and costly.

Therefore, it is necessary to provide a silicon chip having a through via and a method for making the same to solve the above problems.

SUMMARY OF THE INVENTION

The present invention is directed to a silicon chip having a through via. The silicon chip comprises a silicon substrate, a passivation layer, at least one electrical device and at least one through via. The silicon substrate has a first surface and a second surface. The passivation layer is disposed on the first surface of the silicon substrate, and the passivation layer has a surface. The electrical device is disposed in the silicon substrate, and exposed to the second surface of the silicon substrate. The through via penetrates the silicon substrate and the passivation layer. The through via comprises a barrier layer and a conductor. The through via has a first end and a second end. The first end is exposed to the surface of the passivation layer, and the second end connects the electrical device.

The present invention is further directed to a method for making a silicon chip having a through via. The method comprises the following steps: (a) providing a silicon chip, wherein the silicon chip comprises a silicon substrate, at least one electrical device and at least one through via, the silicon substrate has a first surface and a second surface, the electrical device is disposed in the silicon substrate and exposed to the second surface of the silicon substrate, the through via is formed in the silicon substrate, the through via comprises a barrier layer and a conductor, and the through via has a first end and a second end, and the second end connects the electrical device; (b) removing part of the silicon substrate from the first surface of the silicon substrate so as to expose the first end of the through via; (c) forming a passivation layer so as to cover the exposed first end of the through via, wherein the passivation layer has a surface; and (d) removing part of the passivation layer, so that the first end of the through via is exposed to the surface of the passivation layer.

In the present invention, since the first end of the through via is exposed to the surface of the passivation layer, when a redistribution layer is formed on the surface of the passivation layer, the redistribution layer will not contact the silicon substrate, thus avoiding a short circuit. Therefore, a lower resolution process can be used, which results in low manufacturing cost and simple manufacturing process.

DETAILED DESCRIPTION OF THE INVENTION

Figure 1:
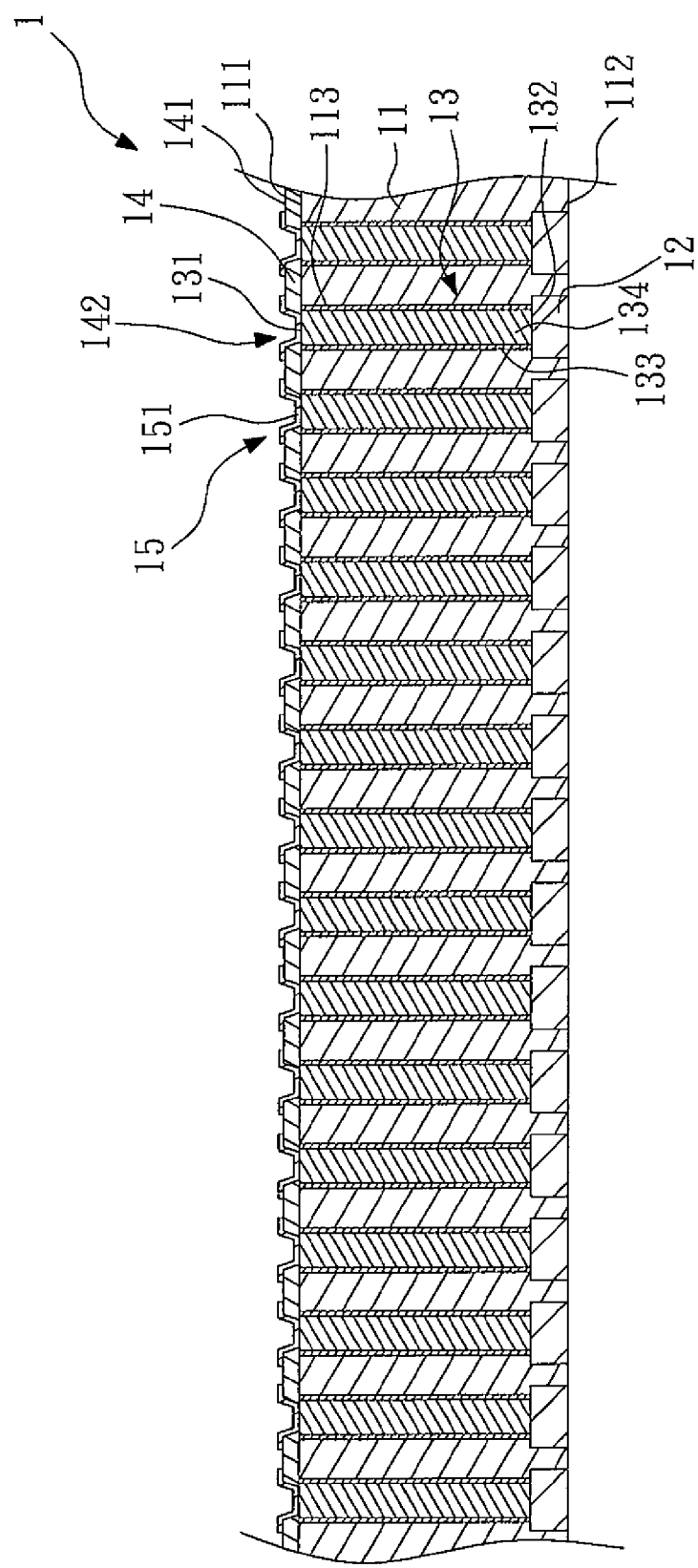
FIG. 1 is a cross-sectional view of a conventional silicon chip having a through via.
Figure 2:
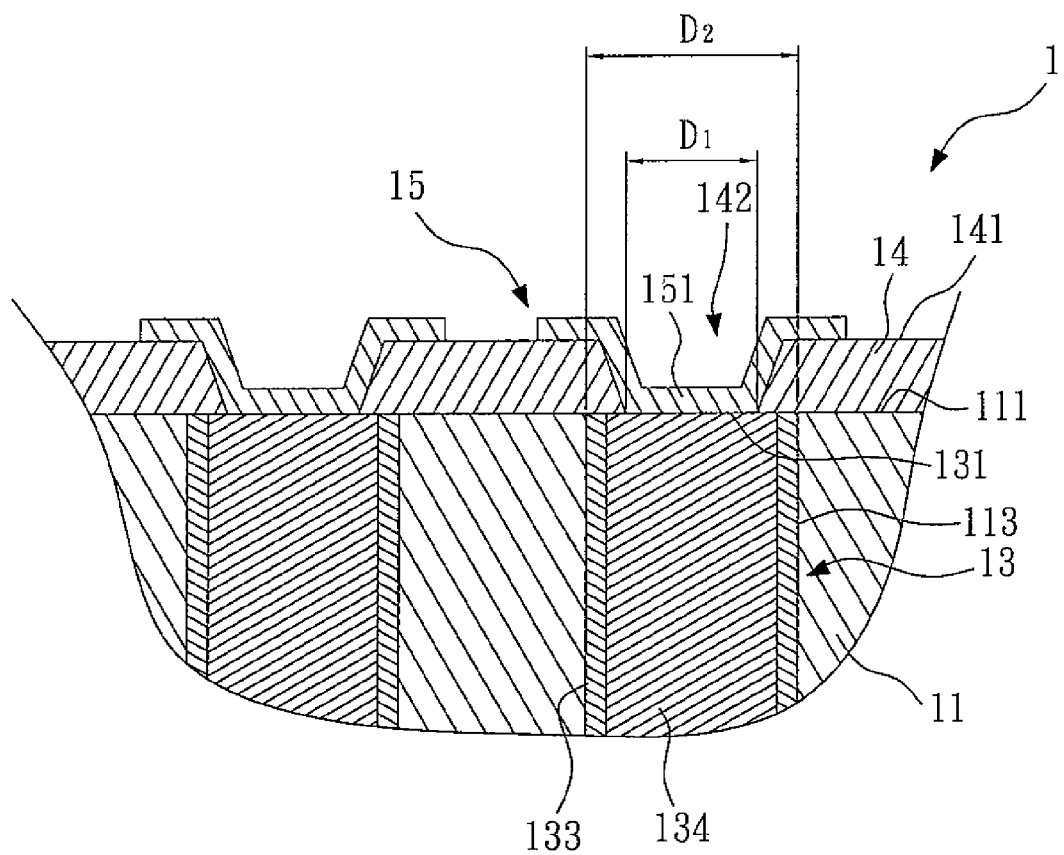
FIG. 2 is a partial enlarged view of FIG. 1.
Figure 3:
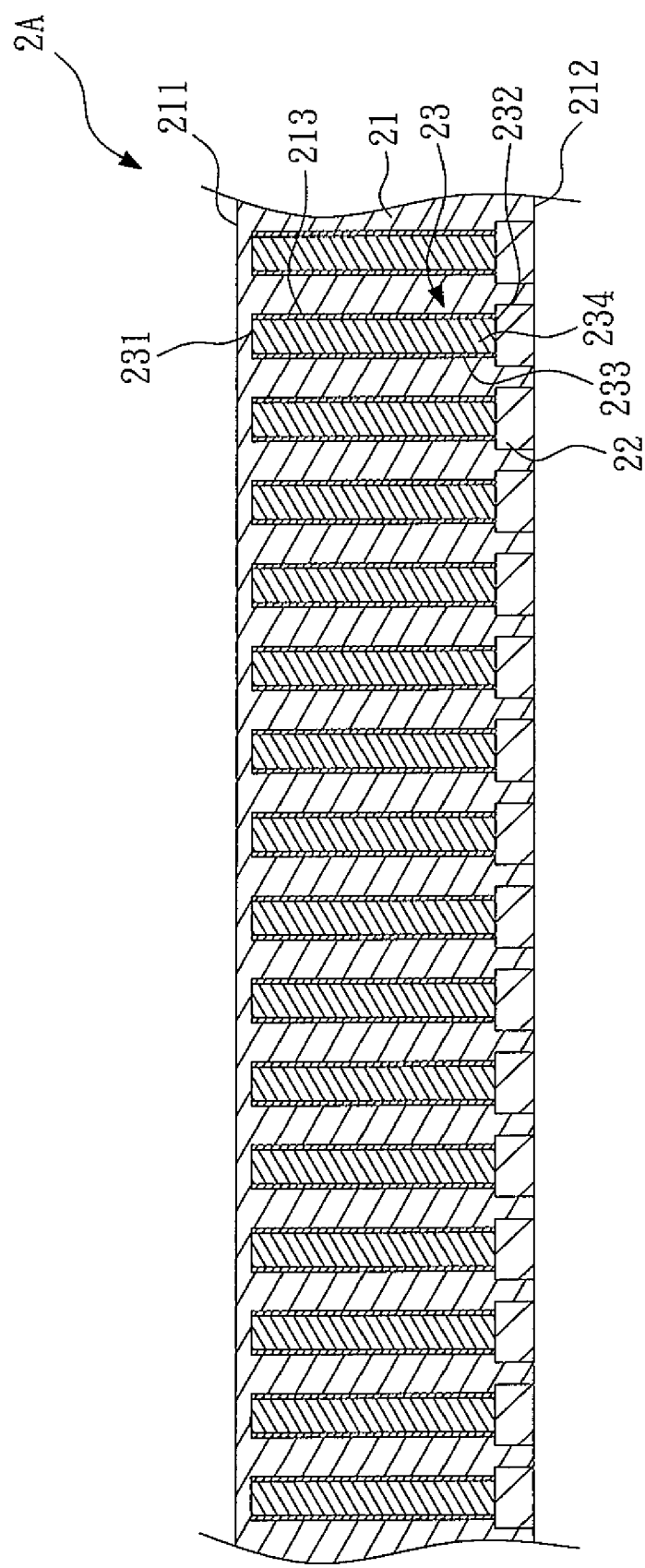
FIGS. 3 to 7 are schematic views of a method for making a silicon chip having a through via according to the present invention.

FIGS. 3 to 7 show schematic views of a method for making a silicon chip having a through via according to the present invention. In FIG. 3, a silicon chip 2A is provided. The silicon chip 2A comprises a silicon substrate 21, at least one electrical device 22 and at least one through via 23. The silicon substrate 21 has a first surface 211 and a second surface 212. In the embodiment, the silicon substrate 21 further has a first through hole 213. The electrical device 22 is disposed in the silicon substrate 21, and exposed to the second surface 212 of the silicon substrate 21. The electrical device 22 is a complementary metal-oxide-semiconductor (CMOS). The through via 23 is formed in the silicon substrate 21. The through via 23 comprises a barrier layer 233 and a conductor 234, and has a first end 231 and a second end 232. The second end 232 connects the electrical device 22. The through via 23 does not penetrate the silicon substrate 21, that is, the first end 231 of the through via 23 is not exposed to the first surface 211 of the silicon substrate 21. The barrier layer 233 is disposed on the side wall of the first through hole 213, the conductor 234 is disposed in the barrier layer 233, and the conductor 234 of the through via 23 is made of copper.

Figure 4:
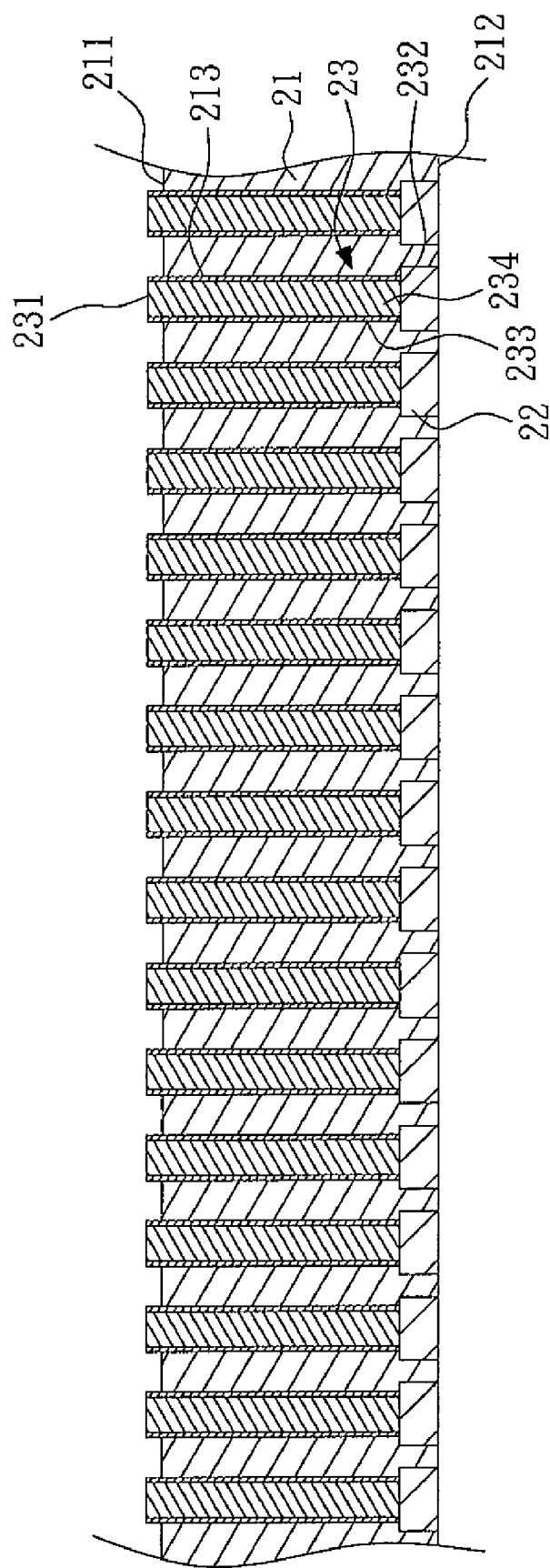
Figure 5:
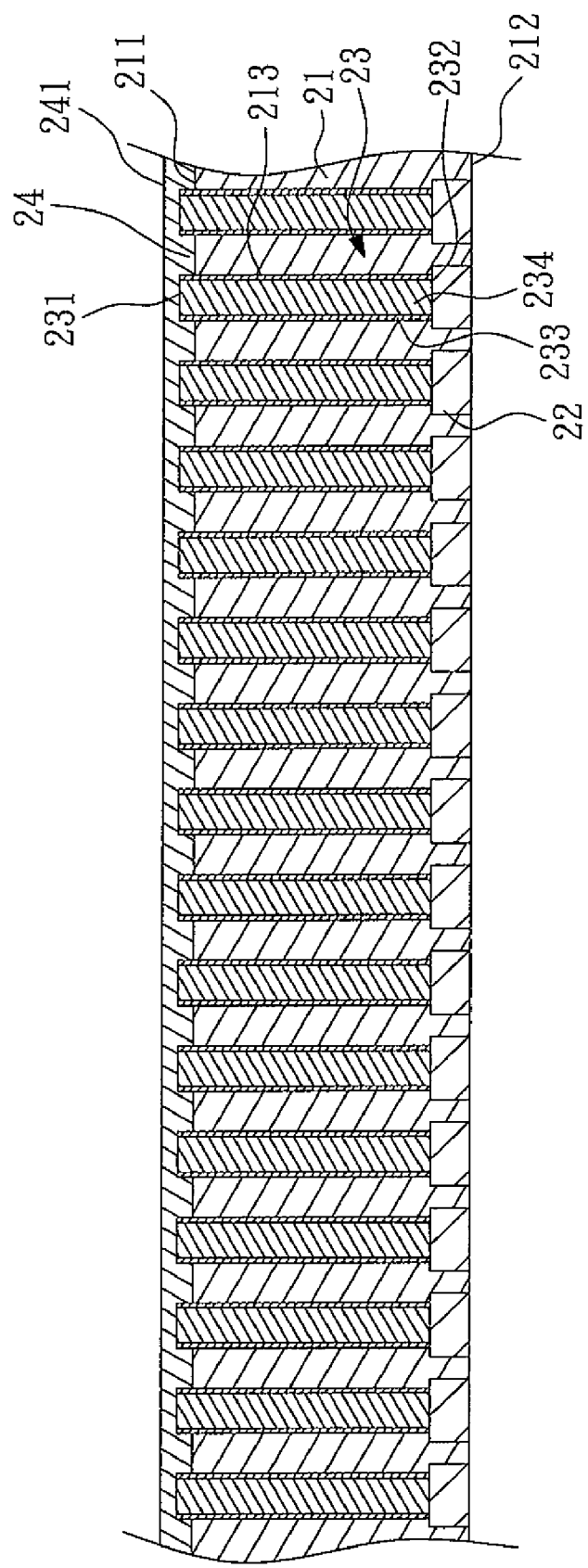

In FIG. 4, part of the silicon substrate 21 is removed from the first surface 211 of the silicon substrate 21 so as to protude the first end 231 of the through via 23, wherein the top surface of the barrier layer 233 is substantially coplanar with the top surface of the conductor 234. In the embodiment, part of the silicon substrate 21 is removed from the first surface 211 of the silicon substrate 21 by etching, grinding or chemical-mechanical polishing (CMP). In FIG. 5, a passivation layer 24 is formed so as to cover the protuded first end 231 of the through via 23, and the passivation layer 24 has a surface 241. In the embodiment, the passivation layer 24 is a polymer having low dielectric constant, for example, polyimide (PI) or benzocyclobutance (BCB). The dielectric constant of the passivation layer 24 is preferably less than 4.

Figure 6:
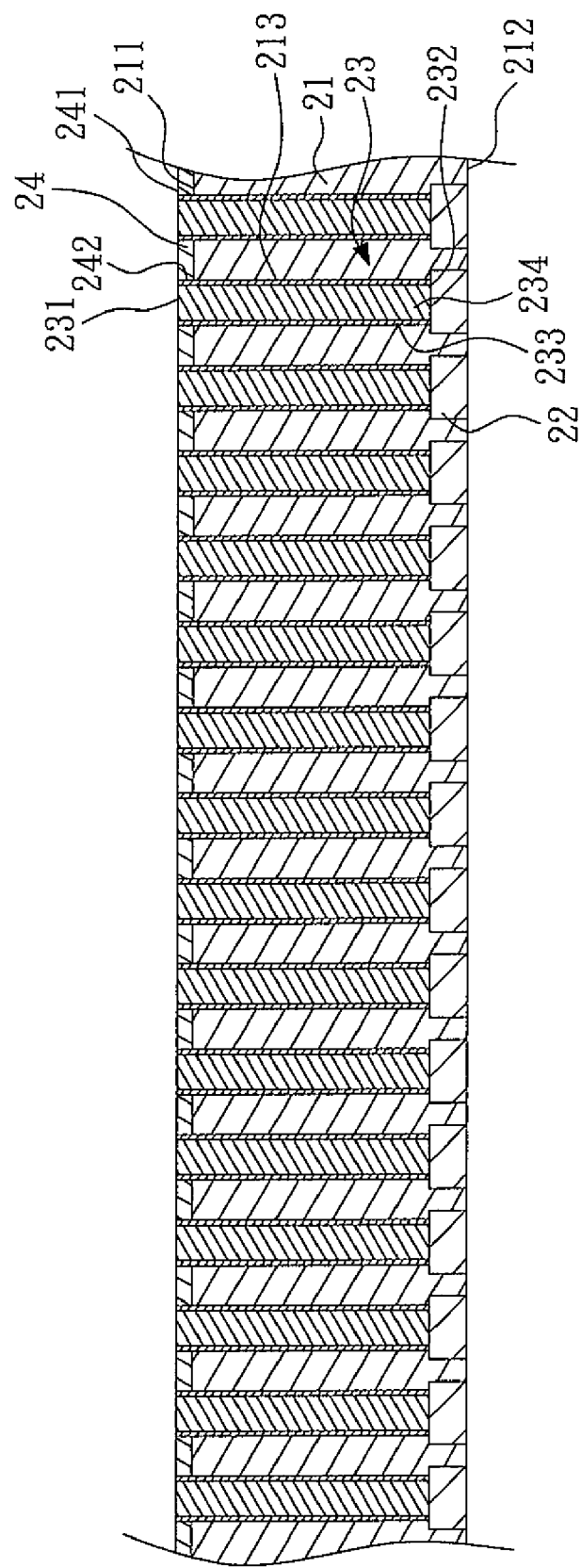

In FIG. 6, part of the passivation layer 24 is removed, so that the first end 231 of the through via 23 is exposed to the surface 241 of the passivation layer 24. In the embodiment, part of the passivation layer 24 is removed by etching or grinding. The silicon substrate 21 has the first through hole 213, the passivation layer 24 has a second through hole 242. The first through hole 213 and the second through hole 242 have the same diameter, and connect and align with each other, and the through via 23 is formed in the first through hole 213 and the second through hole 242.

Figure 7:
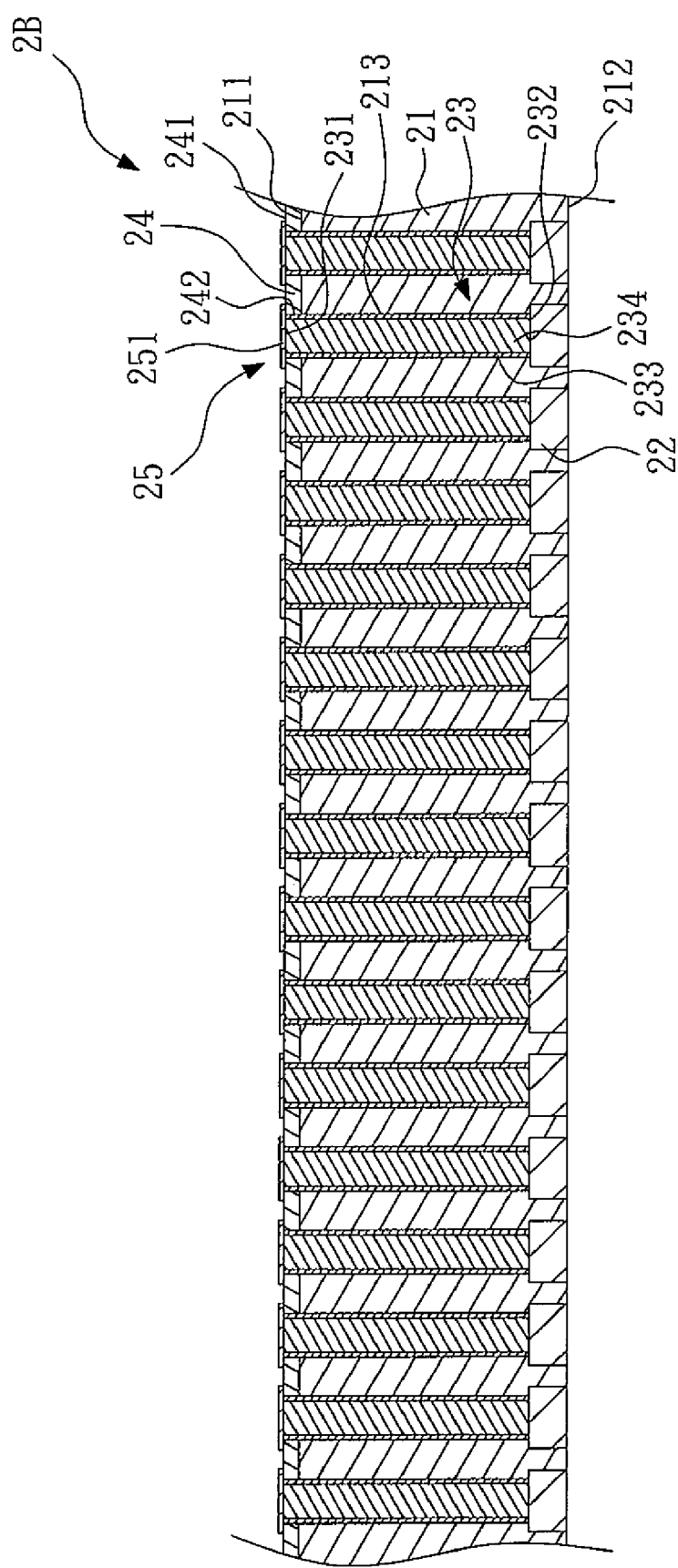

In FIG. 7, in the embodiment, a redistribution layer (RDL) 25 is further formed on the surface 241 of the passivation layer 24, and a silicon chip 2B having a through via according to the present invention is formed. The redistribution layer 25 has at least one electrically connecting area 251, and the electrically connecting area 251 connects the first end 231 of the through via 23. Preferably, the electrically connecting area 251 of the redistribution layer 25 is larger than or completely covers a cross-sectional area of the first end 231 of the through via 23.

Figure 8:
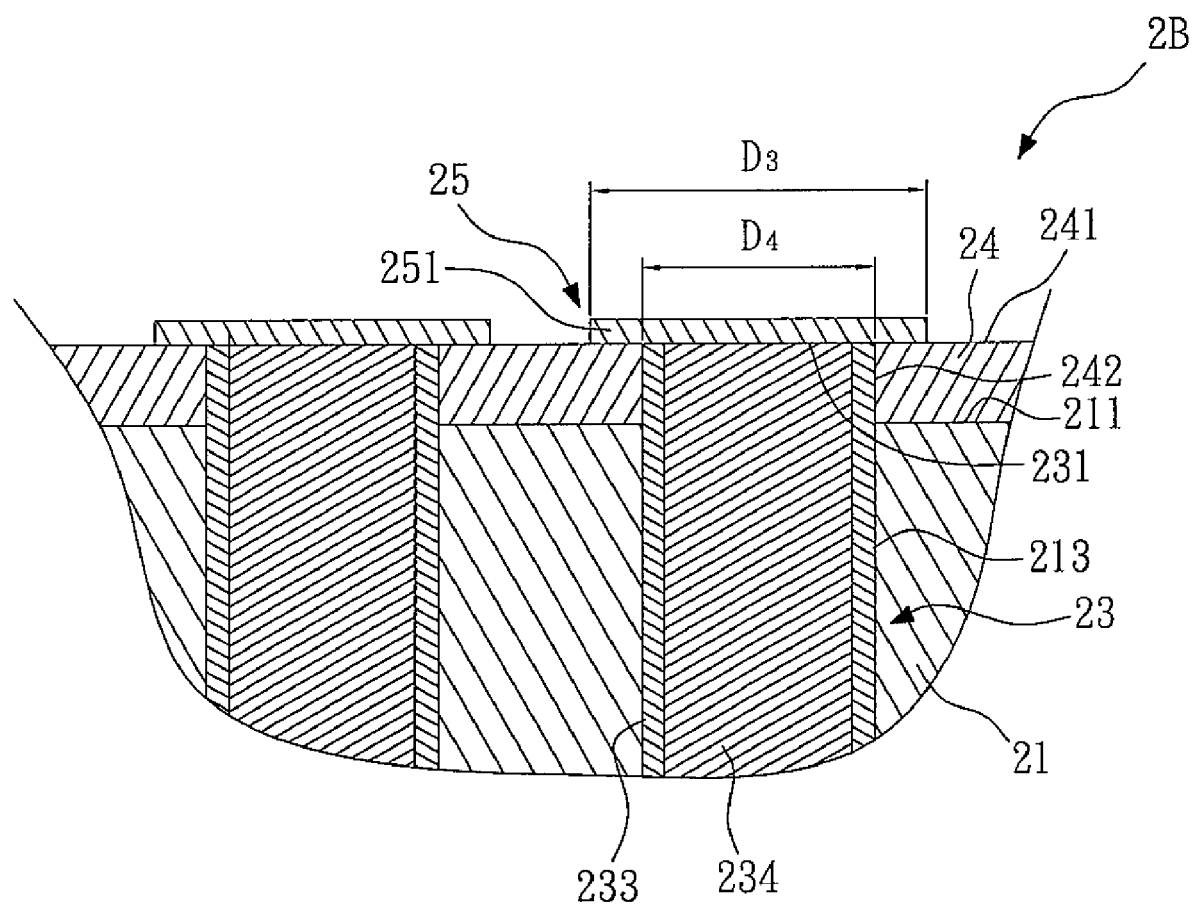
FIG. 8 is a partial enlarged view of FIG. 7.

FIG. 7 shows a cross-sectional view of a silicon chip having a through via according to the present invention, and FIG. 8 is a partial enlarged view of FIG. 7. The silicon chip 2B having a through via comprises a silicon substrate 21, a passivation layer 24, at least one electrical device 22 and at least one through via 23. In the embodiment, the silicon chip 2B having a through via further comprises a redistribution layer (RDL) 25.

The silicon substrate 21 has a first surface 211 and a second surface 212. The passivation layer 24 is disposed on the first surface 211 of the silicon substrate 21, and the passivation layer 24 has a surface 241. In the embodiment, the passivation layer 24 is a polymer having low dielectric constant, for example, polyimide (PI) or benzocyclobutance (BCB). The dielectric constant of the passivation layer 24 is preferably less than 4. The electrical device 22 is disposed in the silicon substrate 21, and exposed to the second surface 212 of the silicon substrate 21. In the embodiment, the electrical device 22 is a complementary metal-oxide-semiconductor (CMOS).

The through via 23 penetrates the silicon substrate 21 and the passivation layer 24. The through via 23 comprises a barrier layer 233 and a conductor 234, and the through via 23 has a first end 231 and a second end 232. The first end 231 is exposed to the surface 241 of the passivation layer 24, and the second end 232 connects the electrical device 22. In the embodiment, the conductor 234 of the through via 23 is made of copper. The silicon substrate 21 has a first through hole 213, and the passivation layer 24 has a second through hole 242. The first through hole 213 and the second through hole 242 have the same diameter, and connect and align with each other. The through via 23 is formed in the first through hole 213 and the second through hole 242, the barrier layer 233 is disposed on the side wall of the first through hole 213 and the second through hole 242, and the conductor 234 is disposed in the barrier layer 233.

In the embodiment, the redistribution layer 25 is disposed on the surface 241 of the passivation layer 24, and the redistribution layer 25 has at least one electrically connecting area 251, and the electrically connecting area 251 connects the first end 231 of the through via 23. Preferably, the electrically connecting area 251 of the redistribution layer 25 is larger than or completely covers a cross-sectional area of the first end 231 of the through via 23.

In the silicon chip 2B having a through via, since the first end 231 of the through via 23 is exposed to the surface 241 of the passivation layer 24, when the diameter $D_3$ of the electrically connecting area 251 of the redistribution layer 25 is greater than the diameter $D_4$ of the first end 231 of the through via 23, the electrically connecting area 251 of the redistribution layer 25 only contacts the passivation layer 24, and will not contact the silicon substrate 21, thus avoiding a short circuit. Therefore, a lower resolution process can be used, which results in low manufacturing cost and simple manufacturing process.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for making a silicon chip having a through via, comprising the steps of:
    (a) providing a silicon chip, wherein the silicon chip comprises a silicon substrate, at least one electrical device and at least one through via, the silicon substrate has a first surface and a second surface, the electrical device is disposed in the silicon substrate and exposed to the second surface of the silicon substrate, the through via is formed in the silicon substrate, the through via comprises a barrier layer and a conductor, the through via has a first end and a second end, and the second end connects the electrical device;
    (b) removing a part of the silicon substrate from the first surface of the silicon substrate so as to protrude the first end of the through via, wherein a top surface of the barrier layer is substantially coplanar with a top surface of the conductor;
    (c) forming a passivation layer so as to cover the protruded first end of the through via, wherein the passivation layer has a planar top surface; and
    (d) removing a part of the passivation layer, so that the first end of the through via is exposed to the surface of the passivation layer and is coplanar with the top surface of the passivation layer.

2. The method as claimed in claim 1, wherein in step (a), the conductor of the through via is made of copper.

3. The method as claimed in claim 1, wherein in step (b), part of the silicon substrate is removed from the first surface of the silicon substrate by etching, grinding or chemical-mechanical polishing (CMP).

4. The method as claimed in claim 1, wherein in step (c), the passivation layer is a material having low dielectric constant, and the dielectric constant of the material is less than 4.

5. The method as claimed in claim 1, wherein in step (c), the material of the passivation layer is polyimide (PI) or benzocyclobutance (BCB).

6. The method as claimed in claim 1, wherein in step (d), the silicon substrate has a first through hole, the passivation layer has a second through hole, the first through hole and the second through hole have the same diameter, and the through via is formed in the first through hole and the second through hole.

7. The method as claimed in claim 6, wherein the first through hole and the second through hole connect and align with each other.

8. The method as claimed in claim 1, further comprising a step of forming a redistribution layer (RDL) on the surface of the passivation layer after step (d), wherein the redistribution layer has at least one electrically connecting area, and the electrically connecting area connect the first end of the through via.

9. The method as claimed in claim 8, wherein the electrically connecting area of the redistribution layer is larger than a cross-sectional area of the first end of the through via.

10. The method as claimed in claim 9, wherein the electrically connecting area of the redistribution layer only contacts the passivation layer, and does not contact the silicon substrate.

11. The method as claimed in claim 8, wherein the electrically connecting area of the redistribution layer completely covers the first end of the through via.

12. The method as claimed in claim 1, wherein in the step (a), the electrical device is a complementary metal-oxide-semiconductor (CMOS).

13. The method as claimed in claim 1, wherein in the step (a), the through via does not penetrate the silicon substrate,

14. The method as claimed in claim 1, wherein in the step (a), the first end of the through via is not exposed to the first surface of the silicon substrate.

15. The method as claimed in claim 1, wherein in the step (a), the barrier layer is disposed on the side wall of the first through hole, and the conductor is disposed on the barrier layer.

16. The method as claimed in claim 1, wherein in the step (d), a part of the passivation layer is removed by etching or grinding.

* * * * *